United States Patent [19]
Takizawa et al.

[11] Patent Number: 5,838,519
[45] Date of Patent: Nov. 17, 1998

[54] PRINTED CIRCUIT BOARD, MAGNETIC DISK APPARATUS WITH THE PRINTED CIRCUIT BOARD, AND METHOD FOR CONNECTING THE PRINTED CIRCUIT BOARD

[75] Inventors: Toshimitsu Takizawa; Takahiro Asano; Nobuyuki Tanaka, all of Tokyo, Japan

[73] Assignee: Kabushiki Kaisha Toshiba, Kanagawa-ken, Japan

[21] Appl. No.: 928,922

[22] Filed: Sep. 12, 1997

[30] Foreign Application Priority Data

Mar. 17, 1997 [JP] Japan ..................................... 9-063119

[51] Int. Cl.⁶ ........................................................ G11B 5/55
[52] U.S. Cl. ............................................................... 360/106
[58] Field of Search ..................................... 360/104, 106; 439/67, 876; 174/94, 117 F, 117 FF, 250; 228/180.22, 234.1

[56] References Cited

U.S. PATENT DOCUMENTS

| | | | |
|---|---|---|---|
| 5,489,804 | 2/1996 | Pasch | 228/180.22 |
| 5,631,786 | 5/1997 | Erpelding | 360/106 |
| 5,644,448 | 7/1997 | Suzuki | 360/106 |
| 5,644,452 | 7/1997 | Cox et al. | 360/106 |
| 5,668,684 | 9/1997 | Palmer et al. | 360/106 |
| 5,678,287 | 10/1997 | Smith et al. | 228/180.22 |

FOREIGN PATENT DOCUMENTS 7-111177 4/1995 Japan .
8-106617 4/1996 Japan .

*Primary Examiner*—Robert S. Tupper
*Attorney, Agent, or Firm*—Limbach & Limbach L.L.P.

[57] ABSTRACT

A bump of an electrically conductive metal protrudes from an electrode pad of a junction FPC. The bump includes a lead portion that penetrates a conductor pattern and a base layer of the junction FPC and projects on the back side of the base layer. A spare solder layer is formed on the surface of the bump. In soldering the electrode pad of the junction FPC to a connecting pad of a main FPC, the bump and the connecting pad are opposed to each other, and a heat source is pressed against the lead portion of the bump from the side of the base layer of the junction FPC. Heat is transmitted to the spare solder layer through the lead portion and the bump, whereupon the spare solder layer is melted for soldering.

5 Claims, 6 Drawing Sheets

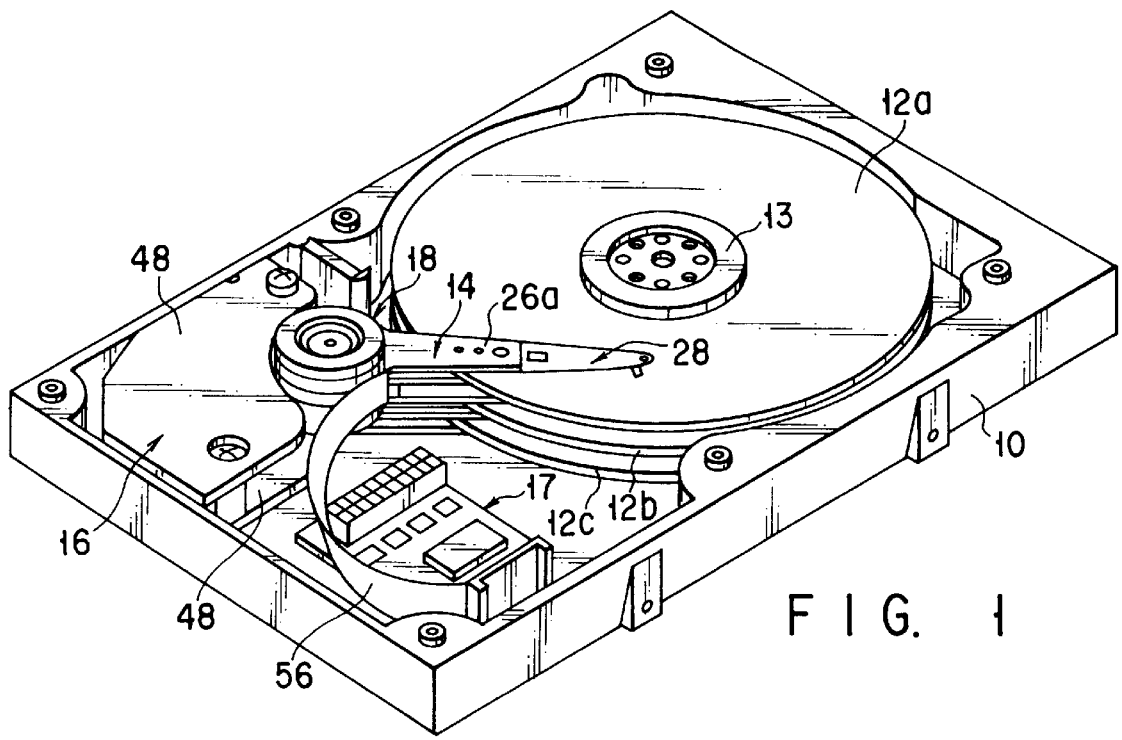
F I G. 1
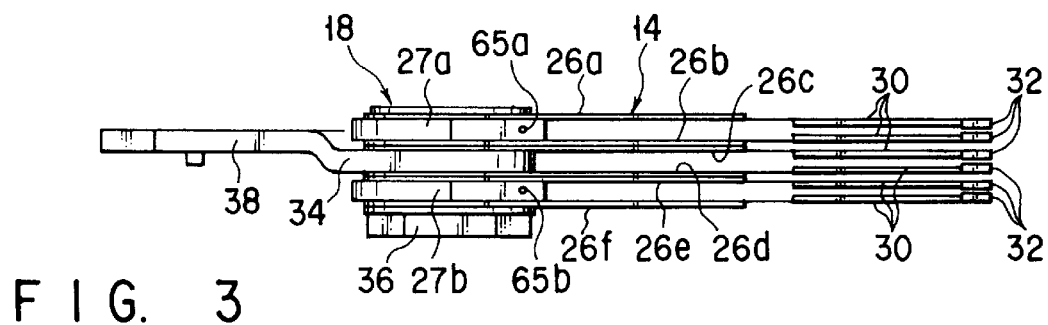
F I G. 3
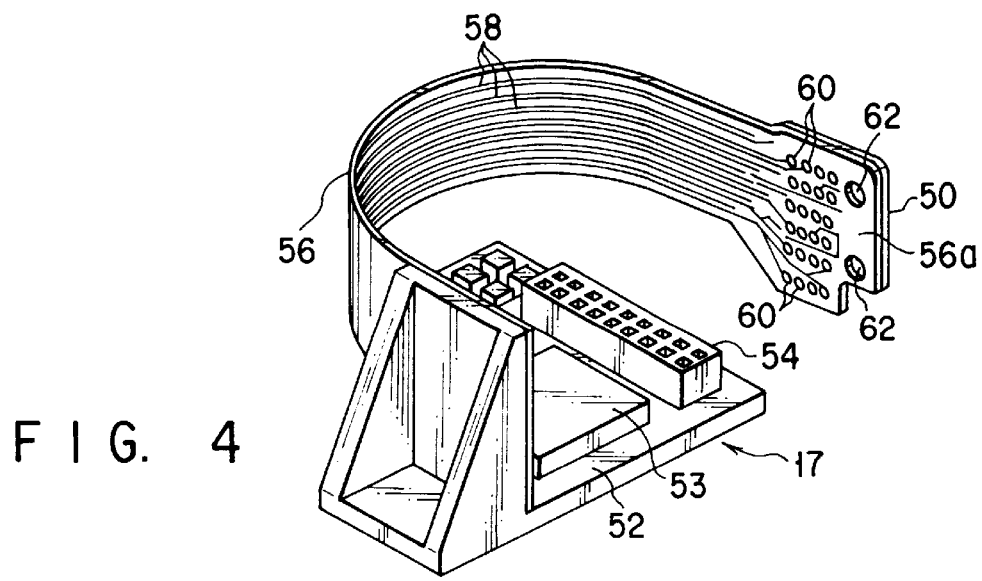
F I G. 4

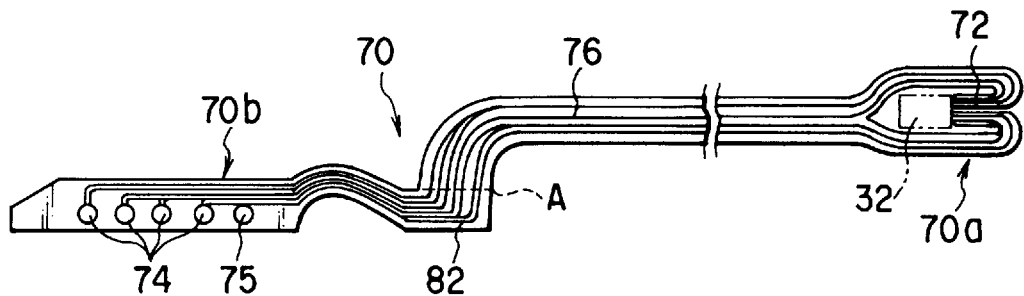
F I G. 7A
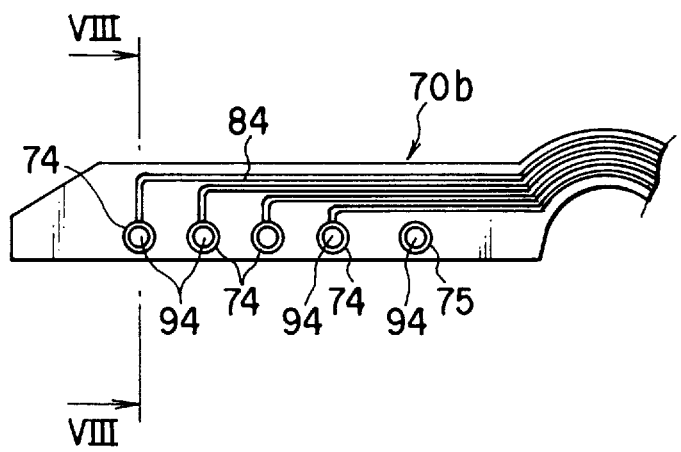
F I G. 7B
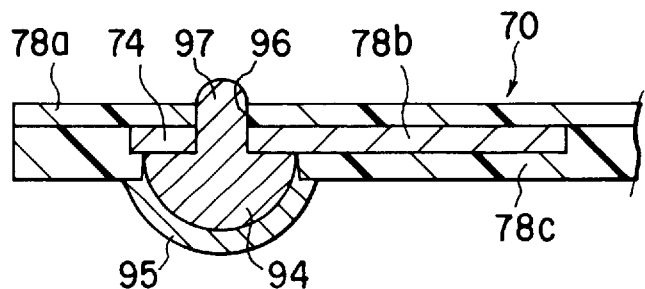
F I G. 8

PRINTED CIRCUIT BOARD, MAGNETIC DISK APPARATUS WITH THE PRINTED CIRCUIT BOARD, AND METHOD FOR CONNECTING THE PRINTED CIRCUIT BOARD

BACKGROUND OF THE INVENTION

The present invention relates to printed circuit boards, a magnetic disk apparatus furnished with the printed circuit boards, and a method for connecting the printed circuit boards.

In general, a rigid or flexible printed circuit board comprises a base layer formed of an insulating material, a conductor pattern formed on the base layer, and a solder resist layer covering the whole conductor pattern except pad sections. Each pad section is precoated with a spare solder layer.

Various modern electronic apparatuses use a plurality of printed circuit boards that are connected to one another. For example, a magnetic disk drive is designed so that lead wires extending from a magnetic head are connected to one end of a flexible printed circuit board (hereinafter referred to as FPC) that is located on a head arm, and the other end of the FPC is soldered for connection to a main FPC that is provided on the proximal end side of a carriage.

In electrically connecting two printed circuit boards, spare solder layers are formed individually on pads of the circuit boards, and these pads are opposed to one another. In this state, the solder layers are heated from the base layer side of one of the circuit boards, whereby they are melted to connect the pads electrically and mechanically.

In order to secure the connection between the pads, a method is used in which bumps of a metal having a melting point higher than that of solder are formed individually on the pads of the one printed circuit board, and the spare solder layers are formed individually on the bumps.

In the conventional arrangement described above, however, heat for molting the solder is applied to the spare solder layers through the base layer of the one printed circuit board, so that it is hard to melt the solder layers quickly and satisfactorily. Accordingly, an oxide layer is liable to be formed on the surface of each spare solder layer, so that solder joints may easily crack, or insufficient connection may be caused. Thus, the connection lacks in reliability.

The formation of the oxide layer may be restrained by using a flux or the like. In the case of a magnetic disk drive or the like, however, outgassing in the system is a critical problem, so that the use of the flux is not advisable.

BRIEF SUMMARY OF THE INVENTION

The present invention has been contrived in consideration of these circumstances, and its object is to provide printed circuit boards capable of being connected easily and securely to one another, a magnetic disk apparatus furnished with the printed circuit boards, and a method for connecting the printed circuit boards.

In order to achieve the above object, a printed circuit board according to the present invention comprises a base layer, a conductor pattern formed on the base layer and including a pad section, a cover layer covering the whole conductor pattern except the pad section, and a bump on the pad section, formed of an electrically conductive material having a melting point higher than that of solder, at least one of the pad section and the bump including a lead portion penetrating the base layer and exposed to the outside.

Another printed circuit board according to the invention comprises a plated through hole having one end opening in the pad section and the other end opening to the outside through the base layer, the bump including a lead portion led out into the plated through hole.

Still another printed circuit board according to the invention comprises a plated through hole having one end opening in the pad section and the other end opening to the outside through the base layer, the bump including a lead portion passed through the plated through hole and projecting outward from the other end.

A magnetic disk apparatus according to the invention comprises a magnetic disk; a magnetic head for recording on and retrieving information from the magnetic disk; a carriage assembly supporting the magnetic head for movement with respect to the magnetic disk; a substrate unit for delivering signals to and from the magnetic head; a main printed circuit board extending from the substrate unit and having an extended end portion attached to the carriage assembly; and a junction printed circuit board provided on the carriage assembly and having one end connected to the magnetic head and the other end connected to the main printed circuit board.

The main printed circuit board includes a base layer, a conductor pattern formed on the base layer and including a pad section, and a cover layer covering the whole conductor pattern except the pad section, while the junction printed circuit board includes a base layer, a conductor pattern formed on the base layer and including a pad section, a cover layer covering the whole conductor pattern except the pad section, and a bump on the pad section, formed of an electrically conductive material having a melting point higher than that of solder. At least one of the pad section and the bump includes a lead portion penetrating the base layer and exposed to the outside.

The bump of the junction printed circuit board is opposed to the pad section of the main printed circuit board across a solder layer, and is soldered to the pad section of the main printed circuit board in a manner such that the solder layer is heated to be melted through the lead portion.

Further, a printed circuit board connecting method according to the invention comprises the steps of: preparing a first printed circuit board including a base layer, a conductor pattern formed on the base layer and including a pad section, and a cover layer covering the whole conductor pattern except the pad section; preparing a second printed circuit board including a base layer, a conductor pattern formed on the base layer and including a pad section, a cover layer covering the whole conductor pattern except the pad section, and a bump on the pad section, formed of an electrically conductive material having a melting point higher than that of solder, at least one of the pad section and the bump including a lead portion penetrating the base layer and exposed to the outside; forming a solder layer on the pad section of the first printed circuit board and on the bump of the second printed circuit board; opposing the pad section of the first printed circuit board and the bump of the second printed circuit board to each other across the solder layers; and soldering the pad section and the bump together by heating the lead portion from the side of the base layer of the second printed circuit board to melt the solder layers.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1 to 10B show a hard disk drive according to an embodiment of the present invention, in which:

FIG. 1 is a perspective view showing the interior of the hard disk drive;

FIG. 2 is an exploded perspective view of a carriage assembly of the hard disk drive;

FIG. 3 is a side view of the carriage assembly;

FIG. 4 is a perspective view showing a substrate unit of the hard disk drive;

FIG. 5 is a sectional view showing a pad section of a main FPC of the substrate unit;

FIG. 6 is an enlarged plan view of an extended end portion of the main FPC;

FIG. 7A is a plan view showing a junction FPC of the hard disk drive;

FIG. 7B is an enlarged plan view of a connecting end portion of the junction FPC;

FIG. 8 is a sectional view taken along line VIII—VIII of FIG. 7B;

FIG. 9 is a side view showing a junction between the extended end portion of the main FPC and each junction FPC in the carriage assembly;

FIGS. 10A and 10B are sectional views individually showing processes for connecting the main FPC and the junction FPC.

DETAILED DESCRIPTION OF THE INVENTION

Figure 2:
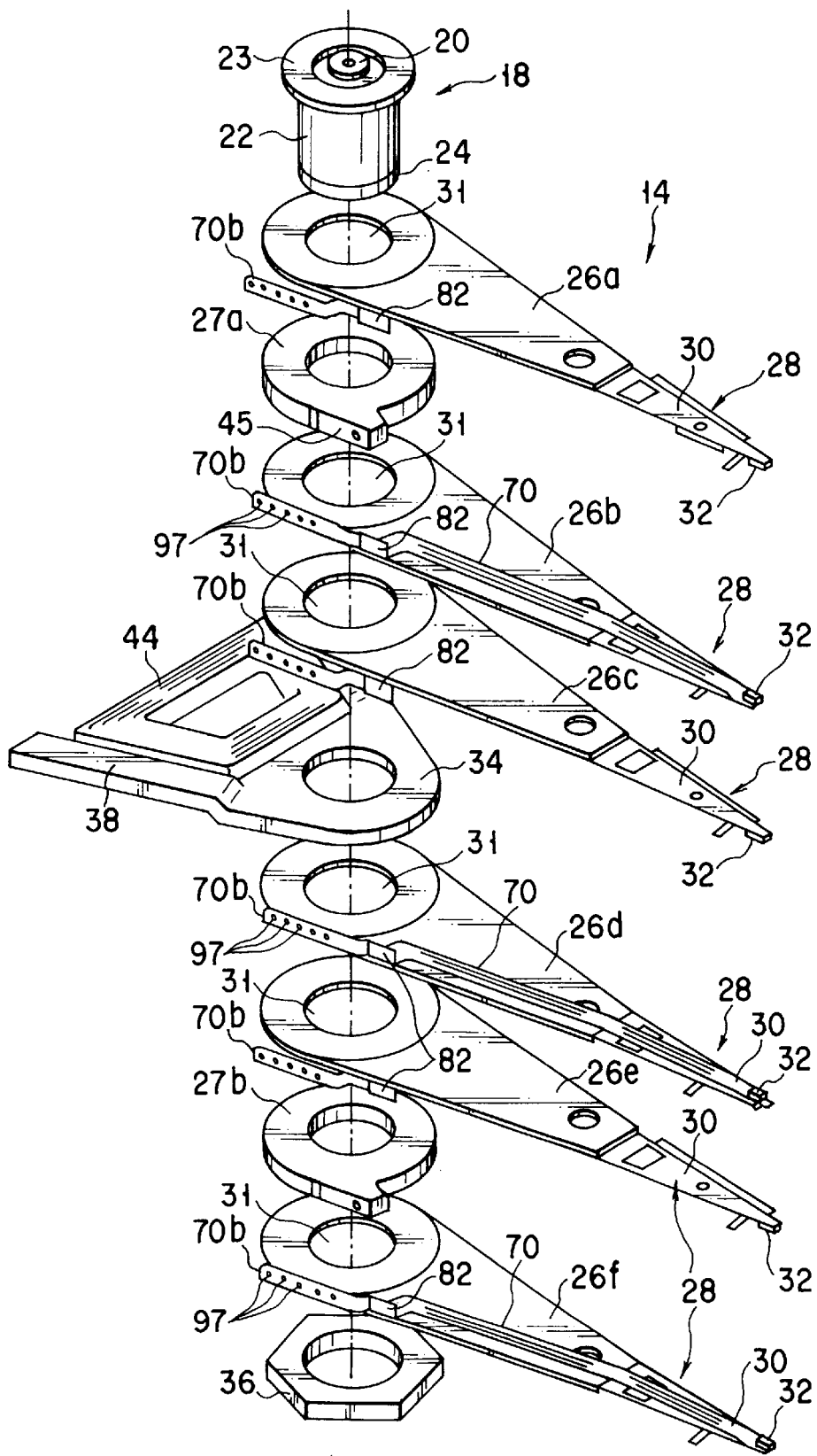

An embodiment of the present invention that is applied to a hard disk drive (hereinafter referred to as HDD) as a magnetic disk apparatus will now be described in detail with reference to the accompanying drawings.

As shown in FIG. 1, the HDD includes a casing 10 in the form of an open-topped rectangular box, and a top cover (not shown), which is fixed to the casing by means of screws so as to close its top opening.

The casing 10 contains therein three magnetic disks 12a, 12b and 12c for use as magnetic recording media, a spindle motor 13 for supporting and rotating these disks, a plurality of magnetic heads for recording on and retrieving information from the magnetic disks. The casing 10 further contains a carriage assembly 14 that supports the magnetic heads for movement with respect to the magnetic disks 12a, 12b and 12c, a voice coil motor (hereinafter referred as VCM) 16 for rotating and positioning the carriage assembly, and a substrate unit 17 that includes a preamplifier and the like.

A printed circuit board (not shown) for controlling the operations of the spindle motor 13, VCM 16, and magnetic heads through the substrate unit 17 is screwed to the outer surface of the casing 10, and is opposed to the bottom wall of the casing.

The magnetic disks 12a, 12b and 12c are formed having a diameter of 65 mm (or 2.5 inches), and is provided with magnetic recording layers on its upper and lower surfaces, individually. These three disks are fitted coaxially on a hub (not shown) of the spindle motor 13, and are arranged in layers at predetermined intervals in the axial direction of the hub. The disks 12a, 12b and 12c are rotated at a given speed by the motor 13.

As shown in FIGS. 1 to 3, the carriage assembly 14 is provided with a bearing assembly 18 fixed on the bottom wall of the casing 10. The bearing assembly 18 includes a pivot 20 set up the bottom wall of the casing 10 and a cylindrical hub 22 rotatably supported on the pivot by means of a pair of bearings. A ring-shaped flange 23 is formed on the upper end of the hub 22, while a screw portion 24 is formed on the outer periphery of the lower end portion of the hub.

Further, the carriage assembly 14 is provided with six arms 26a, 26b, 26c, 26d, 26e and 26f and two spacer rings 27a and 27b mounted on the hub 22 and six magnetic head assemblies 28 supported individually on the arms.

Each of the arms 26a to 26f is a thin plate of about 250 &Lm thickness formed of a stainless-steel-based material, such as SUS 304. A circular aperture 31 is bored through one end or proximal end of each arm.

Each magnetic head assembly 28 includes an elongate suspension 30 and a magnetic head 32 fixed thereto. The suspension 30 is formed of a leaf spring with a thickness of 60 to 70 &Lm, and its proximal end is fixed to the distal end of its corresponding one of the arms 26a to 26f by spot welding or bonding, and extends from the arm.

Each magnetic head 32 includes a substantially rectangular slider (not shown) and an MR (magnetic resistance) head for recording and reproduction, and is fixed to a gimbals portion (not shown) that is formed on the distal end portion of the suspension 30. Also, each magnetic head 32 has four electrodes (not shown). The suspension 30 may be formed of the same material as the arm so as to be integral therewith. The suspensions 30 and the arms constitute an arm section according to the present invention.

The arms 26a to 26f, to which the magnetic head assemblies 28 are fixed individually, are fitted on the hub 22 in a manner such that they are arranged in layers on the flange 23 as the hub is passed through their respective apertures 31. The spacer rings 27a and 27b are fitted on the hub 22 so that they are sandwiched between the arms 26a and 26b and between the arms 26e and 26f, respectively. Further, a support ring 34 is fitted on the hub 22 so as to be interposed between the arms 26c and 26d.

The bearing assembly 18, spacer rings 27a and 27b, and support ring 34 constitute the body structure of the carriage assembly 14.

The six arms 26a to 26f, two spacer rings 27a and 27b, and support ring 34, which are fitted on the hub 22, are sandwiched between the flange 23 and a nut 36 that is screwed on the screw portion 24 of the hub 22, and are fixedly held on the outer circumferential surface of the hub 22. Thus, the arms 26a to 26f are spaced and extend parallel to each other in the same direction from the hub 22.

The respective magnetic heads 32 of those magnetic head assemblies 28 which are attached to the arms 26a and 26b are opposed to each other. Likewise, the respective magnetic heads 32 of those magnetic head assemblies 28 which are attached to the arms 26c and 26d are opposed to each other, and the respective magnetic heads 32 of those magnetic head assemblies 28 which are attached to the arms 26e and 26f are opposed to each other. The arms 26a to 26f and the magnetic head assemblies 28 fixed thereto are rotatable integrally with the hub 22.

The support ring 34 has two support frames 38, which extend in the direction opposite from the arms 26a to 26f, and a coil 44 that constitutes part of the VCM 16 is fixed on these support frames.

When the carriage assembly 14 constructed in this manner is incorporated in the casing 10, as seen from FIG. 1, the magnetic disks 12a, 12b and 12c are situated between the arms 26a and 26b, between the arms 26c and 26d, and between the arms 26e and 26f, respectively.

Those magnetic heads 32 which are attached to the arms 26a and 26b are in contact with the upper and lower surfaces of the magnetic disk 12a, respectively, and hold the disk 12a from both sides. Likewise, those magnetic heads 32 which are attached to the arms 26c and 26d are in contact with the upper and lower surfaces of the magnetic disk 12b, respectively, and hold the disk 12b from both sides. Further, those magnetic heads 32 which are attached to the arms 26e and 26f are in contact with the upper and lower surfaces of the magnetic disk 12c, respectively, and hold the disk 12c from both sides. Each magnetic head 32 is subjected to a given head load by means of the spring force of the suspension 30, and is pressed against the surface of its corresponding magnetic disk when the disk is held at a standstill.

When the carriage assembly 14 is incorporated in the casing 10 in the manner shown in FIG. 1, on the other hand, the coil 44, which is fixed to the support frames 38, is situated between a pair of yokes 48 that are fixed on the casing 10. Along with these yokes 48 and a magnet (not shown) that is fixed to one of the yokes, the coil 44 constitutes the VCM 16. When the coil 44 is energized, the carriage assembly 14 turns, whereupon the magnetic heads 32 are moved to and positioned on desired tracks of the magnetic disks 12a, 12b and 12c, individually.

As shown in FIGS. 1 and 4, the substrate unit 17 includes a rectangular substrate body 52 that is fixed on the bottom wall of the casing 10, and a plurality of electronic components 53, connector 54, etc. are mounted on the substrate body. Also, the substrate unit 17 includes a belt-shaped main flexible printed circuit board (hereinafter referred to as main FPC) 56, which electrically connects the substrate body 52 and the carriage assembly 14. The main FPC 56, which functions as a main printed circuit board, extends from the substrate body 52, and a reinforcing plate 50 is pasted on the back of its extended end portion 56a. The main FPC 56 is formed integrally with the substrate body 52.

Figure 5:
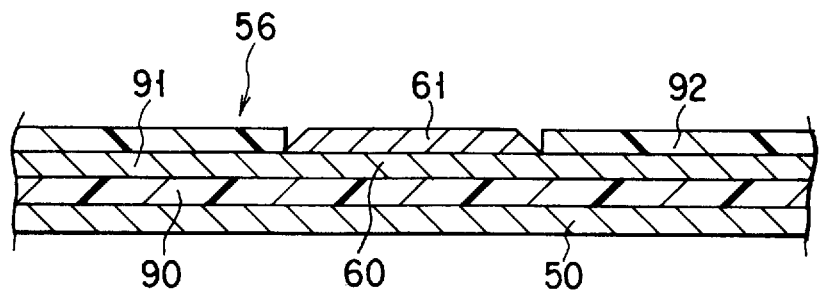

As shown in FIG. 5, the main FPC 56 includes a base film (base layer) 90 of an insulating material such as polyimide, a conductor pattern 91 obtained by patterning a copper leaf formed on the base film, and a solder resist layer (cover layer) 92 of an insulating material that covers the whole area of the pattern 91 and the film 90 except pad sections 60 (mentioned later) of the pattern. A spare solder layer 61 is coated on the surface of each pad section 60.

Figure 6:
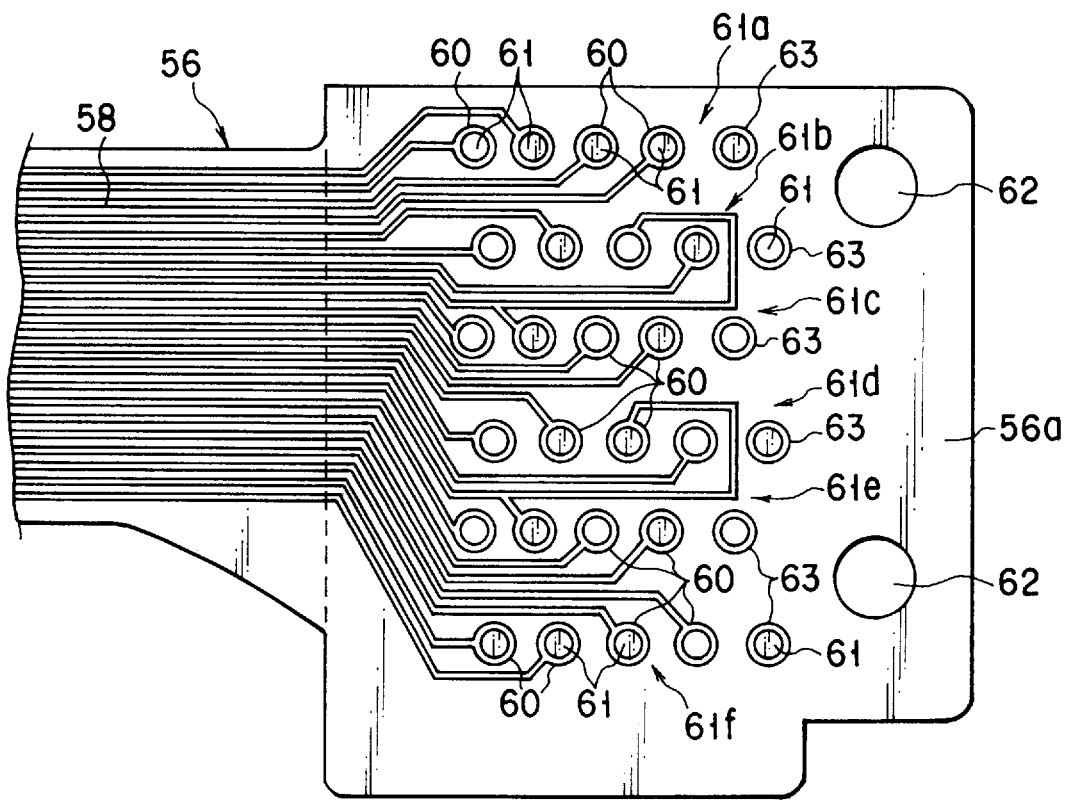

As shown in FIGS. 4 to 6, the conductor pattern 91 of the main FPC 56 includes a large number of conductive lines 58, which extend parallel to one another in the axial direction of the FPC. The extended end portion 56a of the main FPC 56 is formed having connecting pads (pad sections) 60 in six sets 61a to 61f, which correspond in number to the magnetic heads 32. The pads 60 electrically conduct to the substrate body 52 by means of the conductive lines 58, individually. The connecting pads 60 in each set are four in number, corresponding to the number of electrodes of each magnetic head 32, and are arranged straight at regular intervals in the axial direction of the FPC 56, for example. The sets 61a to 61f are arranged parallel to one another and at predetermined intervals in a direction perpendicular to the axial direction of the main FPC 56.

Each of the sets 61a to 61f is composed including an auxiliary pad 63 for reinforcement that is located in line with its corresponding connecting pads 60.

The connecting pads 60 and the auxiliary pad 63 are circular in shape, for example, and their respective surfaces are precoated with the spare solder layer 61 each. The extended end portion 56a is formed having a pair of apertures 62 through which its distal end portion is screwed to the bearing assembly 18 of the carriage assembly 14.

The extended end portion 56a of the main FPC 56 is fixed to the bearing assembly 18 of the carriage assembly 14 by screwing screws 66 (see FIG. 9) into tapped holes 65a and 65b (see FIG. 3) in the spacer rings 27a and 27b through the apertures 62, individually.

On the other hand, each magnetic head 32 of the carriage assembly 14 is connected electrically to its corresponding connecting pad set of the main FPC 56 through a junction flexible printed circuit board (hereinafter referred to as junction FPC) 70. As shown in FIG. 2 and FIGS. 7A to 9, the junction FPC 70 is fixed by being pasted on the surfaces of each corresponding arm and suspension 30, and extends from the distal end of the suspension to the proximal end of the arm.

The junction FPC 70 is in the form of an elongate belt as a whole, and includes a distal end portion 70a situated at the distal end of the suspension 30 and a connecting end portion 70b led out from the proximal end of the arm. The distal end portion 70a is provided with four first electrode pads 72, which are connected electrically to their corresponding electrodes of the magnetic head 32. The connecting end portion 70b is provided with four second electrode pads 74 and one auxiliary pad 75. Each second electrode pad (pad section) 74 electrically conducts to its corresponding first electrode pad 72 through a conductive line 76.

As shown in FIG. 8, each junction FPC 70 includes a base layer 78a formed of an insulating material such as polyimide, a conductor pattern 78b that is formed of a copper leaf on the base layer and constitutes the first and second electrode pads 72 and 74, the auxiliary pad 75 and the conductive lines 76, and a solder resist layer 78c of an insulating material that is formed on the whole area of the conductor pattern on the base layer except the first and second electrode pads and the auxiliary pad 75.

A hemispherical bump 94 is formed on each of the second electrode pads 74 and the auxiliary pad 75 by plating. The bump 94 is formed of an electrically conductive metal having a melting point higher than that of solder, such as copper, nickel, or the like. The height of projection of the bump 94 is adjusted to a value greater than the sum of the respective thicknesses of the solder resist layer 78c of the junction FPC 70 and the solder resist layer 92 of the main FPC 56. The outer surface of the bump 94 is precoated with a spare solder layer 95.

As seen from FIG. 8, moreover, each bump 94 is provided integrally with a lead portion 97, which penetrates the conductor pattern 78b and the base layer 78a and projects from the back side of the junction FPC 70. Thus, an aperture 96 is formed penetrating the conductor pattern 78b and the base layer 78a, corresponding in position to each of the second electrode pads 74 and the auxiliary pad 75. Each aperture 96 has a diameter smaller than those of the second electrode pads and the auxiliary pad. The lead portion 97 of each bump 94 projects outward from the back of the base layer 78a through the aperture 96. Each bump 94 and its corresponding lead portion 97 are formed integrally by plating.

As shown in FIG. 7A, a stainless-steel sheet (hereinafter referred to as flexure) 80 of 30 &Lm thickness is pasted on the whole area of the back of the base layer 78a of the junction FPC 70 except the connecting end portion 70b. The junction FPC 70 is fixed to the carriage assembly 14 with the flexure 80 in contact with the respective surfaces of the arm and the suspension 30.

Further, the junction FPC 70 includes a bent portion 82 at that end of the flexure 80 which is situated on the side of the connecting end portion 70b. The bent portion 82 is bent at right angles along a bending line A represented by broken line in FIG. 7A. Thus, as shown in FIGS. 2 and 9, the connecting end portion 70b of each junction FPC 70 extends at right angle to the surface of its corresponding arm and parallel to the extended end portion 56a of the main FPC 56 that is fixed to the bearing assembly 18.

The connecting end portion 70b is in the form of an elongate rectangle that extends in the extending direction of the arm, that is, in the longitudinal direction of the main FPC 56. The four second electrode pads 74 are arranged at predetermined intervals in the longitudinal direction of the main FPC 56, and are oriented in the same manner as the four connecting pads 60 in their corresponding set of the main FPC 56, in particular.

The connecting end portion 70b of each junction FPC 70 constructed in this manner is connected electrically and mechanically to the extended end portion 56a of the main FPC 56 by soldering the second electrode pads 74 individually to the connecting pads 60 in their corresponding set of the main FPC 56. In this case, each connecting end portion 70b and the extended end portion 56a of the main FPC 56 are connected in the following manner.

Figure 9:
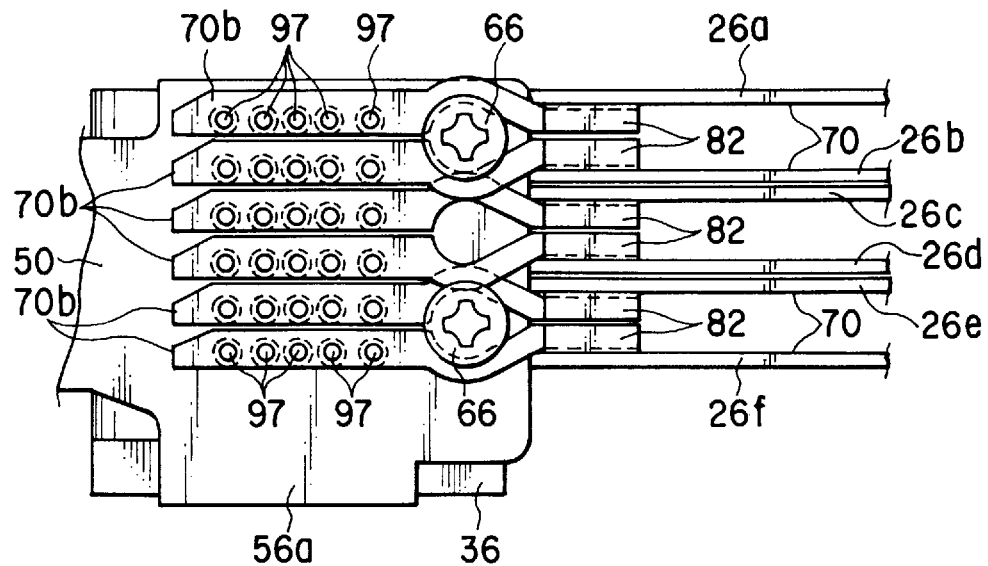
Figure 10A:
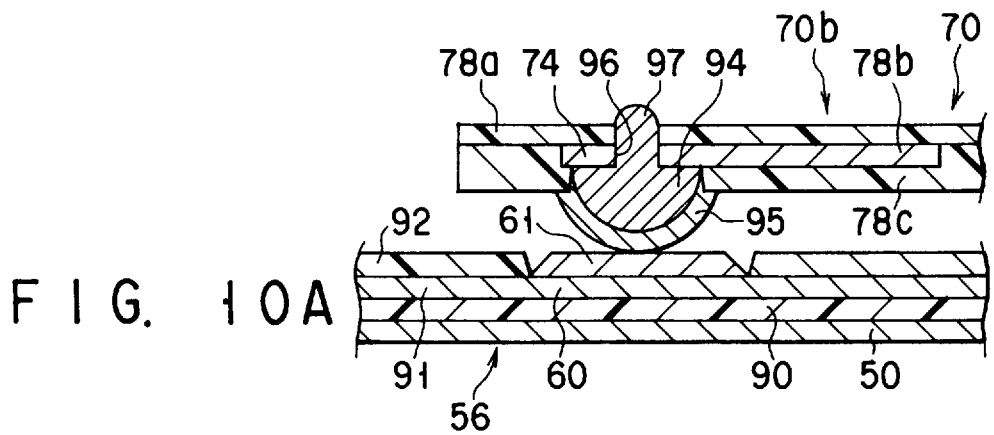
Figure 10B:
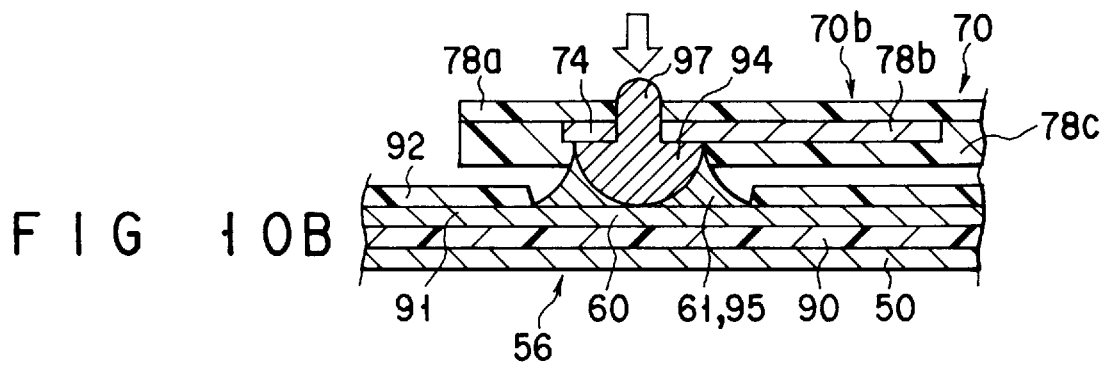

As shown in FIGS. 9 and 10A, each connecting end portions 70b is first opposed to the extended end portion 56a so that its four bumps 94 on the respective second electrode pads 74 are situated individually on the four connecting pads 60 in their corresponding set. In this state, a pulse heater or soldering iron is pressed against the extended end of each lead portion 97 to heat it on the side of the base layer 78a, as shown in FIG. 10B. Thereupon, heat is transmitted to the spare solder layers 95 and 61 through the lead portion 97 and the bump 94, whereby the solder layers are melted. As a result, the bump 94 is soldered to its corresponding connecting pad 60 of the main FPC 56, whereupon each second electrode pad 74 is connected to the pad 60 electrically and mechanically.

Each magnetic head 32 is connected electrically to the substrate unit 17 through its corresponding junction FPC 70 and the main FPC 56 by connecting the connecting end portion 70b of the junction FPC to the extended end portion 56a of the main FPC 56 in the aforesaid manner.

The auxiliary pad 75 provided at each connecting end portion 70b is soldered to its corresponding auxiliary pad 63 of the extended end portion 56a of the main FPC 56 by the same process as aforesaid, whereby the strength of connection of the end portion 70b to the main FPC is enhanced.

Normally, on the other hand, the magnetic heads 32 are inspected before the carriage assembly 14 is assembled. In inspecting each magnetic head 32, according to the HDD constructed in the manner described above, each junction FPC 70 is fixed on the arm and the suspension 30, and the head 32 is connected to the first electrode pads 72. In this state, the magnetic head 32 can be inspected by bringing an inspection probe into contact with the lead portion 97 of the bump 94 that protrudes from the connecting end portion 70b of each junction FPC 70. If the inspection indicates that the magnetic head 32 is subject to no trouble or connection failure, the aforementioned connecting operation is carried out.

According to the HDD constructed in this manner, the bump 94 formed on each second electrode pad 74 of each junction FPC 70 is provided with the lead portion 97 that penetrates the conductor pattern 78b and the base layer 78a and projects on the back side of the base layer. When the pulse heater or soldering iron is pressed against the lead portion 97 on the side of the base layer 78a of the junction FPC 70 in connecting the connecting end portion 70b of the FPC 70 to the connecting pads 60 of the main FPC 56 by soldering, therefore, the resulting heat is transmitted immediately to the spare solder layers 95 and 61 through the metallic lead portion 97 and the bump 94. Accordingly, the solder layers 95 and 61 can be quickly melted for soldering. As a result, an oxide layer cannot be easily formed on the surface of each spare solder layer, and the occurrence of insufficient connection can be reduced. Thus, the time for the connecting operation can be shortened, and the reliability of connection can be improved considerably.

In connecting the connecting end portion 70b of each junction FPC 70 to the connecting pads 60 of the main FPC 56, the four second electrode pads 74 of the FPC 70 can be simultaneously aligned with their corresponding four connecting pads 60 with ease, since they are oriented in the same manner as the pads 60 in their corresponding set. Thus, each four second electrode pads 74 can be simultaneously soldered to their corresponding connecting pads 60 with use of the pulse heater or soldering iron.

Even in the case where the number of signal wires of the magnetic heads to be connected is increased in order to enlarge the capacity of the HDD, therefore, each junction FPC 70 can be easily connected to the main FPC 56, so that the operating time can be shortened. As compared with the conventional case, moreover, the connection can be achieved with a fixed accuracy without depending on the operator's skill, so that the occurrence of connection failure can be reduced to ensure improved reliability.

According to the HDD constructed in this manner, furthermore, each magnetic head 32 can be inspected by utilizing the respective lead portions 97 of the bumps 94 that are attached to each junction FPC 70, so that the junction FPC need not be furnished with any independent pad for inspection or the like. Thus, the construction can be simplified.

FIGS. 11A to 11D show first to fourth modifications, respectively, of the bump 94 and the lead portion 97 of the junction FPC 70. In FIGS. 11A to 11D, like reference numerals are used to designate like portions described in connection with the foregoing embodiment, and a detail description of those portions will be omitted.

Figure 11A:
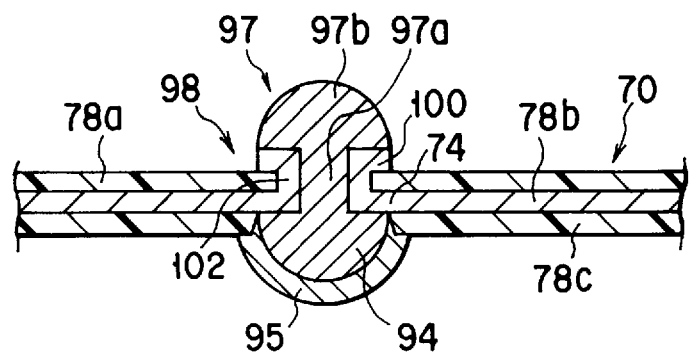
FIGS. 11A to 11D are sectional views showing first to fourth modifications, respectively, of the junction FPC.

According to the first modification shown in FIG. 11A, a conductor pattern 98 is also formed on the back side of the base layer 78a. This conductor pattern 98 is provided with a third electrode pad 100 that faces the second electrode pad 74. The second and third electrode pads 74 and 100 electrically conduct to each other through a plated through hole 102.

On the other hand, the lead portion 97 of the bump 94 formed on the second electrode pad 74 has a rod portion 97a, which extends through the plated through hole 102 to the base layer side, and a hemispherical protuberance 97b formed on the third electrode pad 100. The lead portion 97 is formed of an electrically conductive metal and is integral with the bump 94.

Figure 11B:
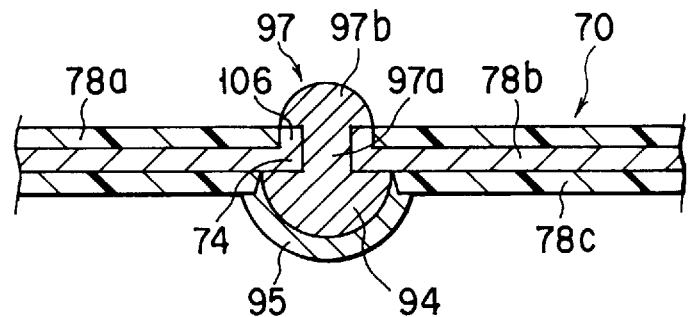

According to the second modification shown in FIG. 11B, the conductor pattern 78b has a plated through hole 106 that is bored through the base layer 78a. One end of the hole 106 opens in the second electrode pad 74, and the other end in the back of the base layer 78a. The lead portion 97 of the bump 94 has a rod portion 97a, which extends through the plated through hole 102 to the base layer side, and a hemispherical protuberance 97b formed over the other-end opening of the hole 102. The lead portion 97 is formed of an electrically conductive metal and is integral with the bump 94.

According to the first and second modifications described above, as in the foregoing embodiment, heat can be transmitted to the spare solder layer 95 through the lead portion 97 and the bump 94 by heating the protuberance 97b of the lead portion 97, so that soldering can be carried out quickly.

Figure 11C:
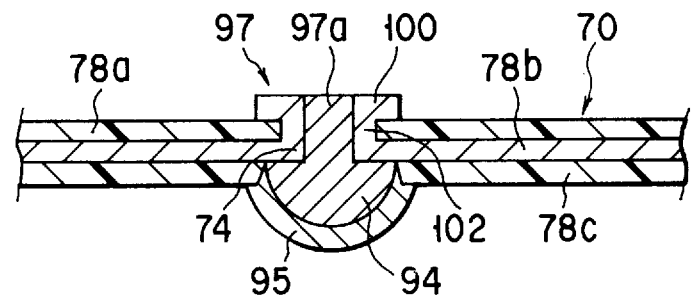

The third modification shown in FIG. 11C is an alternative version of the first modification, in which the protuberance 97b of the lead portion 97 is omitted. Thus, even without the protuberance 97b, heat can be transmitted to the spare solder layer 95 through the plated through hole 102, second electrode pad 74, and bump 94 by heating the third electrode pad 100. Accordingly, the rod portion 97a of the lead portion 97 need not be designed so as to extend to the surface of the third electrode pad 100. According to this third modification, moreover, the plated through hole 102 and the third electrode pad 100 of the conductor pattern 78b also function as a lead portion according to the present invention.

Figure 11D:
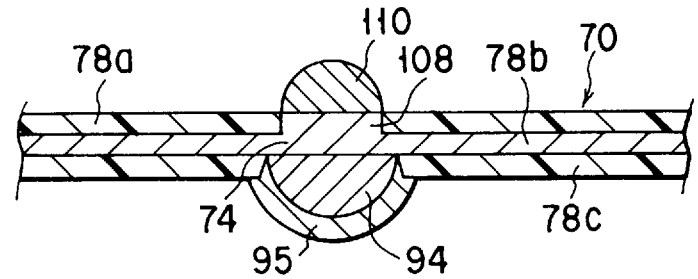

According to the fourth embodiment shown in FIG. 11D, the conductor pattern 78b, not the bump 94, is provided with a lead portion. More specifically, the conductor pattern 78b includes a lead portion 108 that projects from the back side of the second electrode pad 74 through the base layer 78a. The projecting end face of the lead portion 108 is formed flush with the back surface of the base layer 78a. A hemispherical protuberance 110 is formed on the projecting end face by plating it with an electrically conductive metal. Arranged in this manner, the fourth modification can provide the same functions and effects of the foregoing embodiment.

It is to be understood that the present invention is not limited to the embodiment and modifications described above, and that various changes and modifications may be effected therein by one skilled in the art without departing from the scope or spirit of the invention. For example, the plated through hole according to any of the foregoing modifications is not limited to the circular shape, and may be formed having any other suitable shape.

Although the connection between flexible printed circuit boards has been described in association with the foregoing embodiment, moreover, the present invention may be also applied to the connection between a flexible printed circuit board and a rigid printed circuit board. For example, the invention may be applied to the connection between a array substrate of a liquid crystal display unit and a flexible printed circuit board that is mounted with a driver circuit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A magnetic disk apparatus comprising:

a magnetic disk;

a magnetic head for recording on and retrieving information from the magnetic disk;

a carriage assembly supporting the magnetic head for movement with respect to the magnetic disk;

a substrate unit for delivering signals to and from the magnetic head;

a main printed circuit board extending from the substrate unit and having an extended end portion attached to the carriage assembly; and a junction printed circuit board provided on the carriage assembly and having one end connected to the magnetic head and the other end connected to the main printed circuit board, the main printed circuit board including a base layer, a conductor pattern formed on the base layer and including a pad section, and a cover layer covering the whole conductor pattern except the pad section, the junction printed circuit board including a base layer, a conductor pattern formed on the base layer and including a pad section, a cover layer covering the whole conductor pattern except the pad section, and a bump on the pad section, formed of an electrically conductive material having a melting point higher than that of solder, at least one of the pad section and the bump including a lead portion penetrating the base layer and exposed to the outside, the bump of the junction printed circuit board being opposed to the pad section of the main printed circuit board across a solder layer and soldered to the pad section of the main printed circuit board in a manner such that the solder layer is heated to be melted through the lead portion.

2. A magnetic disk apparatus according to claim 1, wherein the bump includes a lead portion penetrating the pad section and the base layer and projecting to the outside.

3. A magnetic disk apparatus according to claim 1, wherein the conductor pattern of the junction printed circuit board includes a lead portion projecting from the pad section through the base layer and exposed to the outside.

4. A magnetic disk apparatus according to claim 1, wherein the junction printed circuit board is provided with a plated through hole having one end opening in the pad section and the other end opening to the outside through the base layer, and the bump includes a lead portion led out into the plated through hole.

5. A magnetic disk apparatus according to claim 1, wherein the junction printed circuit board is provided with a plated through hole having one end opening in the pad section and the other end opening to the outside through the base layer, and the bump includes a lead portion passed through the plated through hole and projecting outward from the other end.

* * * * *